United States Patent
Baker

(10) Patent No.: US 6,319,735 B1
(45) Date of Patent: Nov. 20, 2001

(54) PHOTORESIST DISPENSE METHOD BY COMPENSATION FOR SUBSTRATE REFLECTIVITY

(75) Inventor: Daniel C. Baker, Milpitas, CA (US)

(73) Assignee: Philips Semiconductor, Inc., Tarrytown, NY (US)

( * ) Notice: Subject to any disclaimer, the term of this patent is extended or adjusted under 35 U.S.C. 154(b) by 0 days.

(21) Appl. No.: 09/452,341

(22) Filed: Nov. 30, 1999

(51) Int. Cl.$^7$ .................................................. G01R 31/26
(52) U.S. Cl. ................................................................ 438/14
(58) Field of Search ............................... 436/518; 435/6; 356/73; 438/14, 621; 430/311, 22; 250/492.22; 257/388

(56) References Cited

U.S. PATENT DOCUMENTS

| | | |
|---|---|---|
| 3,680,529 | 8/1972 | Francis . |
| 3,714,525 * | 1/1973 | Brown ................................. 257/388 |
| 4,427,513 | 1/1984 | Skotheim et al. . |
| 4,591,271 | 5/1986 | Byers . |
| 5,874,189 * | 2/1999 | Stroh ..................................... 430/22 |
| 6,020,109 * | 2/2000 | Okamoto ............................. 430/311 |
| 6,048,785 * | 4/2000 | Fulford ................................ 438/621 |
| 6,059,873 * | 5/2000 | Yamaguchi ............................. 117/7 |
| 6,118,516 * | 9/2000 | Irie ........................................ 355/53 |
| 6,122,042 * | 9/2000 | Wunderman .......................... 356/73 |
| 6,175,121 * | 1/2001 | Yamada .......................... 250/492.22 |

FOREIGN PATENT DOCUMENTS

| | | |
|---|---|---|
| 0 930 641 A2 | 7/1999 | (EP) . |
| 0 930 641 A3 | 2/2000 | (EP) . |

\* cited by examiner

*Primary Examiner*—Jey Tsai
*Assistant Examiner*—Andre C Stevenson

(57) ABSTRACT

In the manufacture of a semiconductor device, a method for forming a layer on a semiconductor substrate compensates for variations in wafer substrate reflectivity. The method includes providing substrate illumination and then adjusting the illumination on the substrate. The method also includes controlling the dispensation of material over the substrate as a function of the adjusted illumination. By compensating for variations in wafer substrate reflectivity, manufacturing processes can realize more consistent photoresist coatings on wafer substrates from one wafer lot to another.

17 Claims, 2 Drawing Sheets

PHOTORESIST DISPENSE METHOD BY COMPENSATION FOR SUBSTRATE REFLECTIVITY

FIELD OF THE INVENTION

The present invention relates generally to semiconductor devices and their fabrication and more particularly to a method of applying photosensitive material to a semiconductor wafer.

BACKGROUND OF THE INVENTION

The electronics industry continues to rely upon advances in semiconductor technology to realize higher-functioning devices in more compact areas. For many applications, realizing higher-functioning devices requires integrating a large number of electronic devices into a single silicon wafer. As the number of electronic devices per given area of the silicon wafer increases, the manufacturing process becomes more difficult.

A large variety of semiconductor devices have been manufactured having various applications in numerous disciplines. Such silicon-based semiconductor devices include, among others, metal-oxide-semiconductor (MOS) transistors, such as p-channel MOS (PMOS), n-channel MOS (NMOS) and complimentary MOS (CMOS) transistors, bipolar transistors, and BiCMOS transistors. Each of these semiconductor devices generally includes a semiconductor substrate on which a number of active devices are formed. The particular structure of a given active device can vary between device types. For example, in MOS transistors, an active device generally includes source and drain regions and a gate electrode that modulates current between the source and drain regions.

Elements in semiconductor devices are typically formed in the silicon through the use of well-known deposition, photolithography and etching techniques. The processing of a silicon wafer typically includes a coating step in which a photoresist solution is applied to the wafer. The purpose of the coating step is to apply a uniform polymeric film of selected thickness onto the wafer. This technique is commonly known as spin coating, which involves dispensing the photoresist solution onto the wafer and rapidly spinning the wafer. Spinning the wafer serves to dry the photoresist into a solid or gel layer having the desired film thickness.

The dispensing step is performed by distributing photoresist solution over the entire wafer before the wafer is spun (static dispense) or by applying a small quantity of solution near the center of the wafer while spinning the wafer to distribute the solution (dynamic dispense). During the dispensing step, it is desired to distribute the solution uniformly onto the wafer to allow the formation of a coat of uniform thickness during the spin step. The dispensing apparatus should be maintained at a pre-defined, relatively close distance from the wafer to prevent splashing of the solution. Advanced photoresist dispensing methods have varied wafer rotation speed during chemical delivery of the spin coating cycle in order to achieve uniform photoresist coatings with minimal loss in photoresist material. However, this approach has not always been sufficiently precise in forming the photoresist layer.

In an effort to improve these systems, a light source has been included in the system that is directed at the substrate so that light is reflected up for detection by a camera. Variations in the wafer surface lead to variations in the light reflected. When the camera senses that the substrate is dark (less light reflected up to the camera), more photoresist material is dispensed. The opposite is also true; less photoresist is dispensed if the light reflected off the substrate is too bright. However, the process for depositing photoresist is problematic when the light reflected from the substrate is too dim or the light appears washed out. Variations in wafer surface reflectivity have made it difficult to reproduce from one wafer lot to another, a photoresist layer on a wafer substrate that has a uniform thickness across the wafer surface while at the same time minimizing the required amount of photoresist being dispensed.

Accordingly, there has been a long-standing need for semiconductor manufacturing processes that can overcome the aforementioned disadvantages of the prior art.

SUMMARY OF THE INVENTION

In connection with the present invention, it has been discovered that significant advantages can be gained by precisely detecting when the photoresist material comes into contact with the wafer and using this detection to compensate for variations in substrate reflectivity. Variations in substrate reflectivity cause variations in the detection of the moment of initial photoresist deposition, leading to variations in photoresist layer thickness and uniformity across the wafer surface. The present invention will help to compensate for variations in wafer substrate reflectivity that will lead to photoresist coating on wafer substrates that is consistent from one wafer lot to another.

The present invention is exemplified in a number of implementations and applications, some of which are summarized below. According to an example embodiment, in the manufacture of a semiconductor device a method is provided for forming a layer over a semiconductor substrate that includes providing substrate illumination and then adjusting the illumination on the substrate. The method also includes controlling the dispensation of material over the substrate as a function of the adjusted illumination.

In another example embodiment, an apparatus for forming a layer on a semiconductor substrate is disclosed. The apparatus includes a device, such as a light, for illuminating a substrate and a mechanism for adjusting the illumination on the substrate, wherein the adjustment mechanism is coupled to the substrate illumination device. The apparatus also includes a controller for dispensation of a material over the substrate as a function of the adjusted illumination, wherein the controller is coupled to the adjustment mechanism.

The above summary of the present invention is not intended to describe each illustrated embodiment or every implementation of the present invention. The figures and detailed description that follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
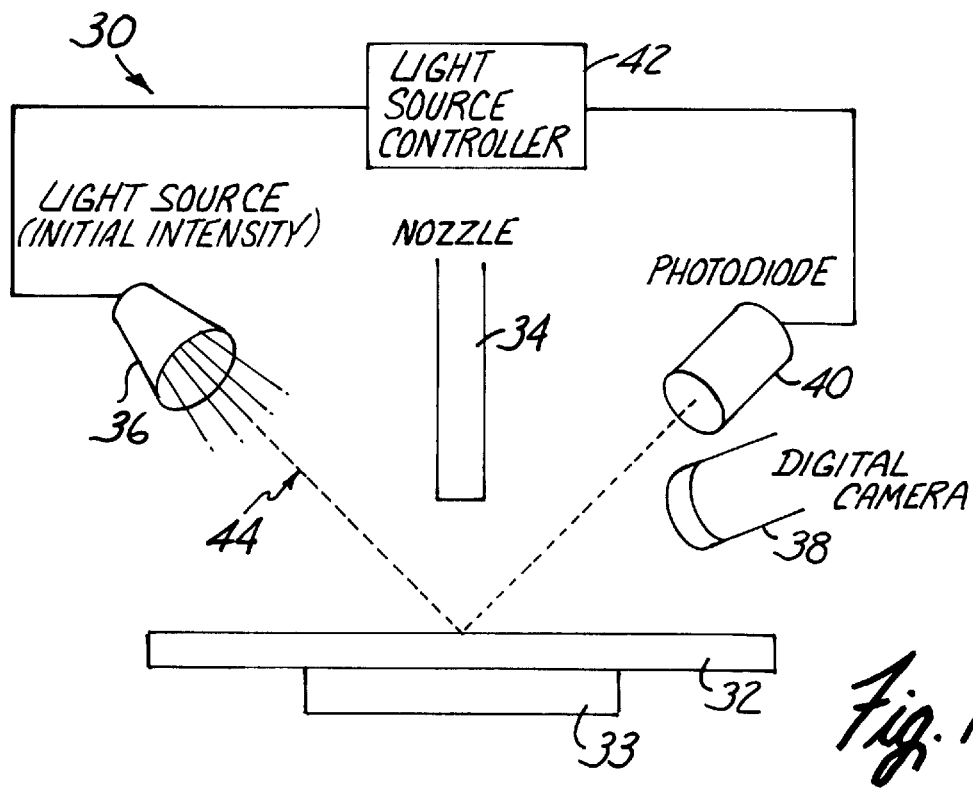
FIG. 1 illustrates an example embodiment of a material deposition system for semiconductor wafer substrates that is arranged to measure light reflected from a substrate, made in accordance with the teachings of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of different types of semiconductor devices and the manufacturing processes related thereto. The present invention has been found to be particularly suited for forming photoresist layers on substrates that have consistent thickness and uniformity across the wafer surface from lot to lot. While the present invention is not necessarily limited to such devices and processes, various aspects of the invention may be appreciated through a discussion of various examples using this context.

In connection with an example embodiment of the present invention, a method is provided for forming a layer over a semiconductor substrate. The method includes providing substrate illumination and then adjusting the illumination on the substrate. The method also includes controlling the dispensation of material over the substrate as a function of the adjusted illumination.

In another example embodiment, an apparatus for forming a layer over a semiconductor substrate is disclosed. The apparatus includes a device for illuminating a substrate and a mechanism for adjusting the illumination on the substrate, wherein illumination adjustment mechanism is coupled to substrate illumination device. The apparatus also includes a controller for dispensation of a material over the substrate as a function of the adjusted illumination, wherein the controller is coupled to illumination adjustment mechanism.

Referring now to the drawings, FIG. 1 illustrates one embodiment of the present invention that addresses the issue of layer formation uniformity. Material deposition system 30 includes a wafer substrate 32, disposed on a spinning mechanism 33, a nozzle 34 for dispensing of a material (such as a photoresist), a light source 36 and a camera 38 (or any other photographic device or imaging mechanism). In this example, camera 38 is a digital camera. System 30 further includes a light detecting device 40, such a photodiode detector shown in this example embodiment, that is coupled to a light source controller 42. Light source controller 42 is also coupled to light source 36 and controls the intensity of light 44 in response to the reflected light received at photodiode 40.

Figure 2:
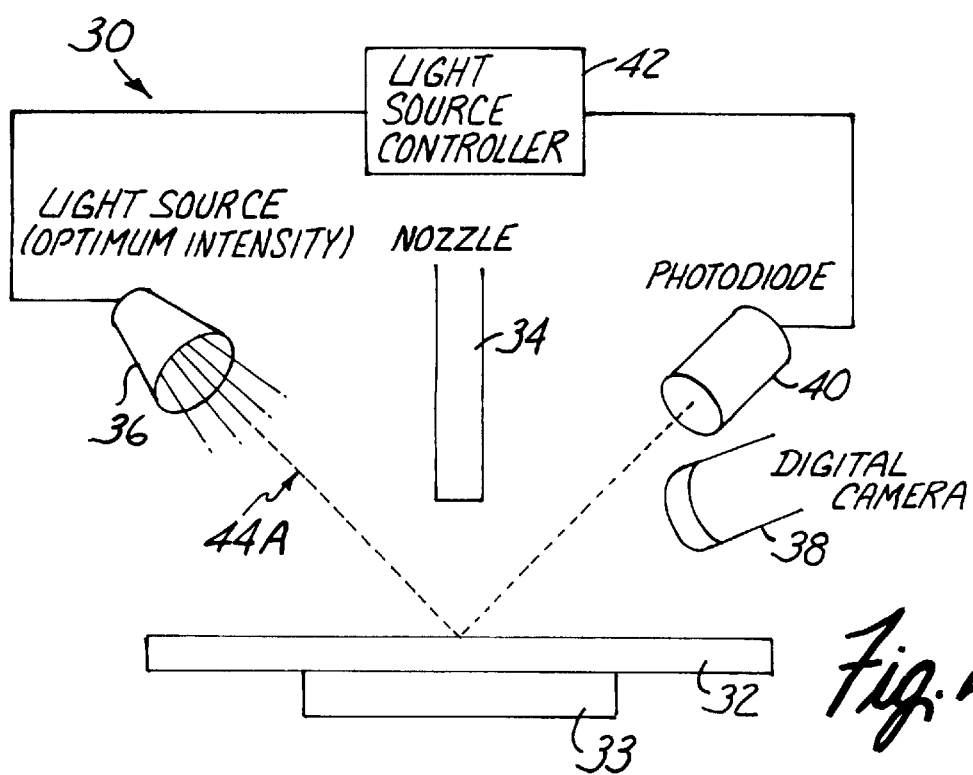
FIG. 2 illustrates the system of FIG. 1 that is arranged to adjust the reflectivity of light from the substrate to a predetermined level, made in accordance with the teachings of the present invention.

Referring to FIG. 2, light 44 is adjusted to a predetermined level depending on the amount of light reflected from substrate 32 that is detected by photodiode detector 40. Photodiode detector 40 is in the system to check the substrate reflectivity of each substrate prior to photoresist material dispensing. The amount of light reflected depends on the wafer surface topography. Upon receiving a signal from photodiode 40, light source controller 42 then signals a change to light source 36. This results in a new light intensity 44A to be directed at the substrate, set to a predetermined level, which optimizes the light being reflected from the substrate.

Figure 3:
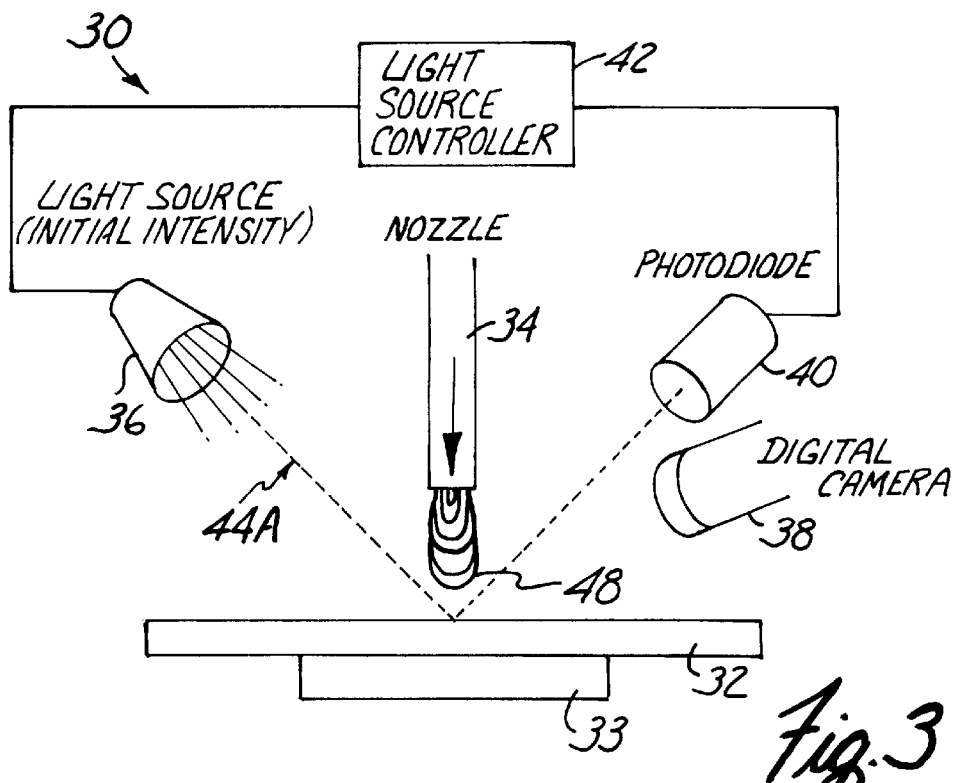
FIG. 3 illustrates the system of FIG. 2 that is arranged to dispense the photosensitive material after the substrate reflectivity has been adjusted, made in accordance with the teachings of the present invention.

Referring to FIG. 3, after the light intensity has been optimized the next step in the process is to dispense photoresist material 48 from nozzle 34 onto substrate 32. The photoresist can be deposited while substrate 32 is stationary, for a static dispense, or while the substrate is being spun by spinning mechanism 33, for a dynamic dispense, depending on what the specifications require for photoresist layer thickness. When photoresist material 48 makes contact with substrate 32, camera 38 will detect this event. The timely detection of material 48 making contact with substrate 32 will ensure that the proper amount of photoresist is deposited.

In order to prevent contamination of the photoresist layer or prevent outside spraying of photoresist material during the spinning cycle, the material deposition system may be located in an enclosed area. The enclosed area is usually comprised of walls that are a series of windows that are either reflective and/or transparent. This type of arrangement allows stray light from internal and external sources to be reflected back to the substrate surface, thereby distorting the reflectivity measurements that are being taken by the detection system at the start of the photoresist deposition process. External light usually penetrates one or more of the enclosed area glass walls and reflects off of the substrate. The camera then detects additional light coming from the substrate and proceeds to signal a change to the deposition nozzle that will lead to less photoresist material being dispensed on the substrate.

Figure 4:
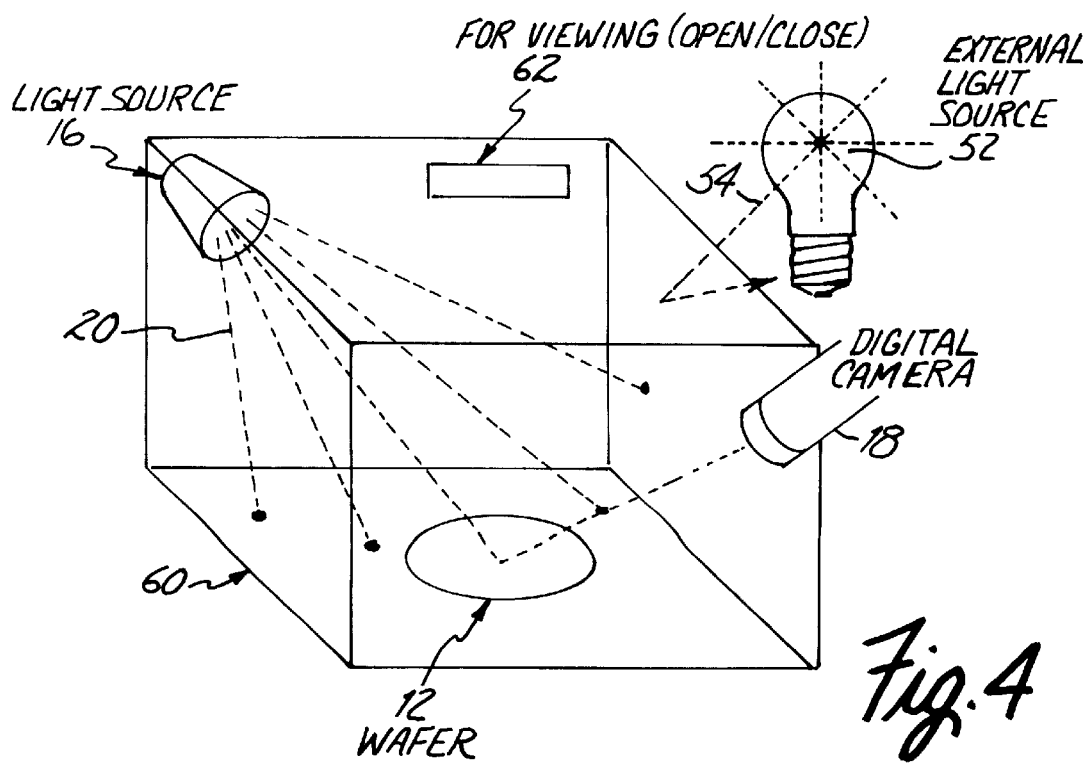
FIG. 4 illustrates an example embodiment of a material deposition system for semiconductor wafer substrates located within an enclosed area, made in accordance with the teachings of the present invention.

Referring to FIG. 4, a second example embodiment is illustrated for controlling the illumination level of the light that is being reflected from the substrate in order to promote consistent substrate reflectivity measurements by the detection system. Photoresist material deposition system 30 can be located within an enclosure 60 that is comprised of walls that have surfaces that have been coated with non-reflective material. External source of light 52 has light waves 54 reflected off one of the walls to prevent it from passing through and being reflected off substrate 12, thereby distorting the amount of light being detected by camera 18. Further, the internal light source 16 has light waves 20 either illuminating substrate 12 or having stray waves absorbed by one of the walls of enclosure 60 to prevent light from coming back to the substrate and distorting the amount of light being detected by camera 18. One of the walls can include a reduced transparent window area 62, which can be in the form of a slit, for viewing the photoresist deposition process. In various embodiments, camera 18 is a digital camera and can also be a conventional non-digital camera.

In yet another embodiment, enclosure 60 provides the capability of controlling 8 the light that is being reflected off the substrate to improve the overall material deposition system. Such control is advantageous to enhance the uniformity of the resulting photoresist layer without the costs of retrofitting the system with a controller and a photodiode. In this embodiment, enclosure 60 could easily be used in a current photoresist deposition system that uses a light detection system to determine when the photoresist material makes contact with the substrate. Where more precision is required in forming the photoresist layer, system 30 is located within enclosed area 60 to further control the light that is being reflected from the substrate. In yet another embodiment, system 30 and enclosure 60 could also be used in other coating processes, either together or separately, where light reflected from a substrate is used to detect a particular processing event.

The present invention is not limited to photoresist materials and can be used when a substrate is to be coated with a particular material.

While the present invention has been described with reference to several particular example embodiments, those skilled in the art will recognize that many changes may be made thereto without departing from the spirit and scope of the present invention, which is set forth in the following claims.

What is claimed is:

1. In the manufacture of a semiconductor device, a method for forming a layer over a semiconductor substrate, comprising:

providing illumination on the substrate;

adjusting the illumination; and controlling the dispensation of a material over the substrate as a function of the adjusted illumination.

2. The method according to claim 1, wherein adjusting the illumination includes detecting the illumination, and measuring light that is reflected from the substrate.

3. The method according to claim 1, further including adjusting the illumination of the substrate to an optimum level of substrate reflectivity.

4. The method according to claim 3, wherein controlling dispensation of material includes:

dispensing the material after the substrate reflectivity has been optimized; and detecting when the dispensed material contacts the substrate.

5. The method according to claim 1 wherein adjusting the illumination includes:

detecting a level of substrate reflectivity; and optimizing the level of substrate reflectivity by adjusting the intensity of substrate illumination.

6. The method according to claim 2, wherein detecting the illumination includes using a photodiode detector.

7. The method according to claim 6, wherein controlling the dispensation includes coupling a light source to the photodiode detector.

8. The method according to claim 2, wherein controlling the dispensation includes defining a light-controlled environment and optimizing the illumination on the substrate to a given level of substrate reflectivity.

9. The method according to claim 8, wherein the light-controlled environment includes providing an enclosure for forming therein the layer over the substrate, the enclosure including walls having a non-reflective material coating thereon.

10. The method according to claim 1, further including adjusting the illumination after forming a first layer on the substrate prior to forming a second layer over the semiconductor substrate.

11. A method for forming a layer over a semiconductor substrate, comprising:

providing illumination on the substrate;

detecting a level of substrate reflectivity;

optimizing the level of substrate reflectivity by adjusting the intensity of substrate illumination;

dispensing a material over the substrate after the substrate reflectivity has been optimized; and detecting when the dispensed material makes contact with the substrate.

12. The method according to claim 11, wherein detecting the substrate reflectivity includes using a photodiode detector.

13. The method according to claim 11, further including providing an enclosure for forming therein the photoresist layer on the substrate, the enclosure including walls having a non-reflective material coating thereon, whereby signal noise is reduced and substrate reflectivity measurement is improved.

14. The method according to claim 13, wherein one of the walls has a reduced transparent window area for viewing the photoresist layer deposition.

15. The method according to claim 1, wherein the step of controlling the dispensation of a material includes controlling the dispensation of a photoresist material.

16. The method according to claim 1, wherein the step of adjusting the illumination includes providing a light source controller coupled to a light detector.

17. The method according to claim 4, further including the step of providing an imaging device for detecting when the dispensed material contacts the substrate.

* * * * *